United States Patent
Gill

(10) Patent No.: US 7,423,849 B2
(45) Date of Patent: Sep. 9, 2008

(54) MAGNETORESISTIVE (MR) ELEMENTS HAVING PINNED LAYERS WITH CANTED MAGNETIC MOMENTS

(75) Inventor: Hardayal S. Gill, Palo Alto, CA (US)

(73) Assignee: Hitachi Global Sotrage Technologies Netherlands B.V. (NL)

( * ) Notice: Subject to any disclaimer, the term of this patent is extended or adjusted under 35 U.S.C. 154(b) by 549 days.

(21) Appl. No.: 11/229,920

(22) Filed: Sep. 19, 2005

(65) Prior Publication Data

US 2007/0064350 A1   Mar. 22, 2007

(51) Int. Cl.
*G11B 5/33* (2006.01)

(52) U.S. Cl. .............................. 360/324.11; 360/324.12

(58) Field of Classification Search ................................. 360/324.11–324.12
See application file for complete search history.

(56) References Cited

U.S. PATENT DOCUMENTS

| | | | |
|---|---|---|---|
| 5,260,652 A | 11/1993 | Collver et al. | |
| 5,574,605 A | 11/1996 | Baumgart et al. | |
| 5,592,082 A | 1/1997 | Kuriyama | |
| 5,828,531 A | 10/1998 | Gill | |
| 5,880,912 A | 3/1999 | Rottmayer | |
| 6,447,935 B1 * | 9/2002 | Zhang et al. | 428/810 |
| 6,466,419 B1 | 10/2002 | Mao | |
| 6,594,124 B2 | 7/2003 | Zheng et al. | |
| 6,866,751 B2 * | 3/2005 | Gill et al. | 204/192.2 |
| 7,330,340 B2 * | 2/2008 | Gill | 360/324.12 |

* cited by examiner

*Primary Examiner*—A. J. Heinz
(74) *Attorney, Agent, or Firm*—Duft Bornsen & Fishman, LLP

(57) ABSTRACT

Magnetoresistive (MR) elements are disclosed that include pinned layers having canted magnetic moments. An MR element of the invention includes a first pinning layer, a first pinned layer, a first spacer/barrier layer, a free layer, a second spacer/barrier layer, a second pinned layer, and a second pinning layer. The first pinned layer has a canted magnetic moment. By having a canted magnetic moment, the first pinned layer acts as a bias layer to bias the free layer, and acts as a reference layer to enhance the MR signal in the MR element.

29 Claims, 4 Drawing Sheets

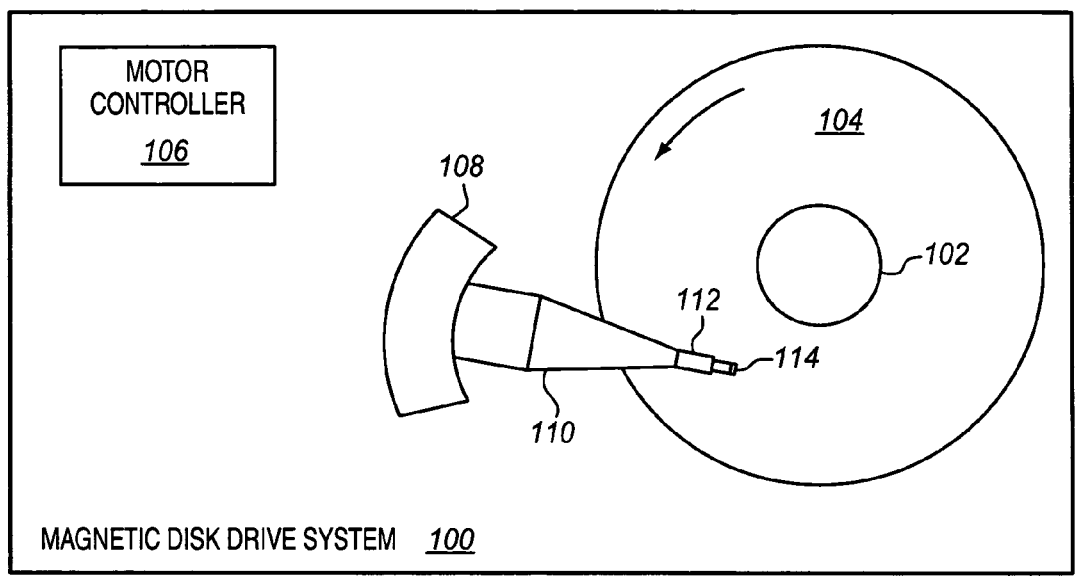
FIG. 1
FIG. 2
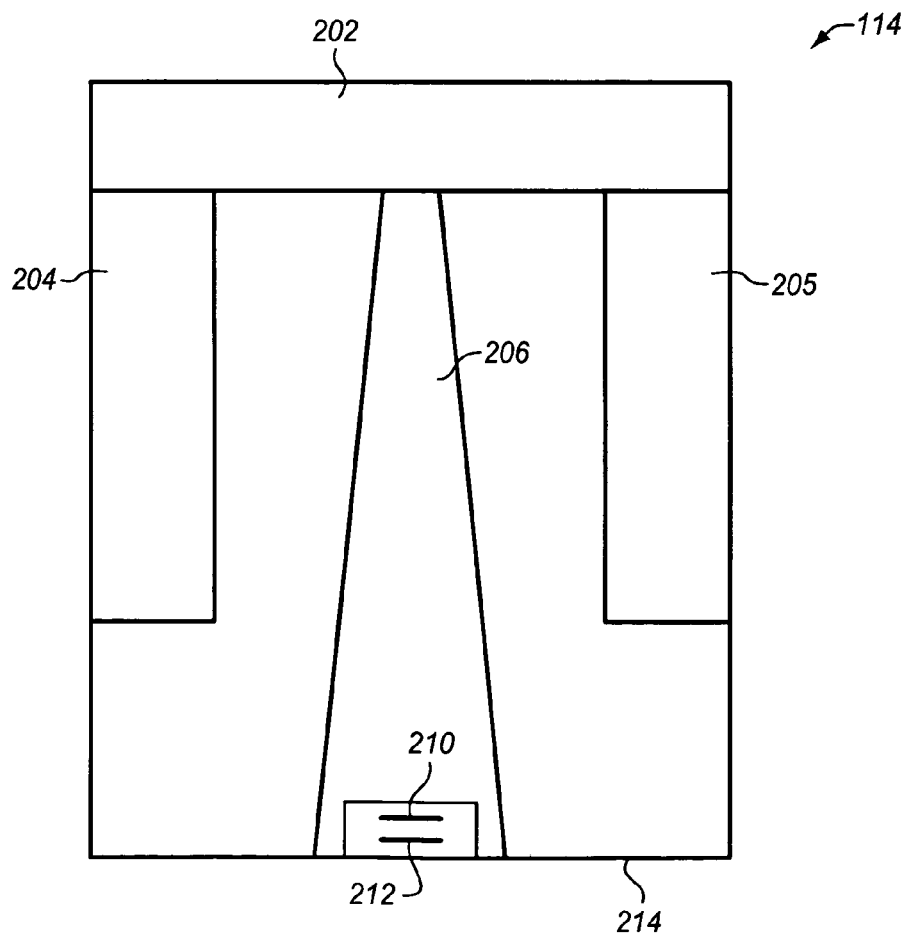

MAGNETORESISTIVE (MR) ELEMENTS HAVING PINNED LAYERS WITH CANTED MAGNETIC MOMENTS

BACKGROUND OF THE INVENTION

1. Field of the Invention

The invention is related to the field of magnetoresistive (MR) elements and, in particular, to MR elements having pinned layers with canted magnetic moments. More particularly, the canted magnetic moment of a pinned layer allows the pinned layer to act as a bias layer to bias the free layer, and act as a reference layer to enhance the MR signal in the MR element.

2. Statement of the Problem

Many computer systems use magnetic disk drives for mass storage of information. Magnetic disk drives typically include one or more recording heads (sometimes referred to as sliders) that include read elements and write elements. A suspension arm holds the recording head above a magnetic disk. When the magnetic disk rotates, an air flow generated by the rotation of the magnetic disk causes an air bearing surface (ABS) side of the recording head to ride a particular height above the magnetic disk. The height depends on the shape of the ABS. As the recording head rides on the air bearing, an actuator moves an actuator arm that is connected to the suspension arm to position the read element and the write element over selected tracks of the magnetic disk.

To read data from the magnetic disk, transitions on a track of the magnetic disk create magnetic fields. As the read element passed over the transitions, the magnetic fields of the transitions modulate the resistance of the read element. The change in resistance of the read element is detected by passing a sense current through the read element and then measuring the change in voltage across the read element. The resulting signal is used to recover the data encoded on the track of the magnetic disk.

The most common type of read elements are magnetoresistive (MR) read elements. One type of MR read element is a Giant MR (GMR) read element. GMR read elements using only two layers of ferromagnetic material (e.g., NiFe) separated by a layer of nonmagnetic material (e.g., Cu) are generally referred to as spin valve (SV) elements. A simple-pinned SV read element generally includes an antiferromagnetic (AFM) layer, a first ferromagnetic layer, a spacer layer, and a second ferromagnetic layer. The first ferromagnetic layer (referred to as the pinned layer or reference layer) has its magnetization typically fixed (pinned) by exchange coupling with the AFM layer (referred to as the pinning layer). The pinning layer generally fixes the magnetic moment of the pinned layer perpendicular to the ABS of the recording head. The magnetization of the second ferromagnetic layer, referred to as a free layer, is not fixed and is free to rotate in response to the magnetic field from the magnetic disk. The magnetic moment of the free layer is free to rotate upwardly and downwardly with respect to the ABS in response to positive and negative magnetic fields from the rotating magnetic disk. The free layer is separated from the pinned layer by the nonmagnetic spacer layer.

Another type of SV read element is an antiparallel pinned (AP) SV read element. The AP-pinned spin valve read element differs from the simple pinned SV read element in that an AP-pinned structure has multiple thin film layers forming the pinned layer instead of a single pinned layer. The AP-pinned structure has an antiparallel coupling (APC) layer between first and second ferromagnetic pinned layers. The first pinned layer has a magnetization oriented in a first direction perpendicular to the ABS by exchange coupling with the AFM pinning layer. The second pinned layer is antiparallel exchange coupled with the first pinned layer because of the selected thickness of the APC layer between the first and second pinned layers. Accordingly, the magnetization of the second pinned layer is oriented in a second direction that is antiparallel to the direction of the magnetization of the first pinned layer.

Another type of MR read element is a Magnetic Tunnel Junction (MTJ) read element. The MTJ read element comprises first and second ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ read element, the first ferromagnetic layer has its magnetic moment pinned (referred to as the pinned layer). The second ferromagnetic layer has its magnetic moment free to rotate in response to an external magnetic field from the magnetic disk (referred to as the free layer). When a sense current is applied, the resistance of the MTJ read element is a function of the tunneling current across the insulating layer between the ferromagnetic layers. The tunneling current flows perpendicularly through the tunnel barrier layer, and depends on the relative magnetization directions of the two ferromagnetic layers. A change of direction of magnetization of the free layer causes a change in resistance of the MTJ read element, which is reflected in voltage across the MTJ read element.

GMR read elements and MTJ read elements may be current in plane (CIP) read elements or current perpendicular to the planes (CPP) read elements. Read elements have first and second leads for conducting a sense current through the read element. If the sense current is applied parallel to the major planes of the layers of the read element, then the read element is termed a CIP read element. If the sense current is applied perpendicular to the major planes of the layers of the read element, then the read element is termed a CPP read element.

Designers of read elements use different techniques to stabilize the magnetic moment of the free layer. Although the magnetic moment of the free layer is free to rotate upwardly or downwardly with respect to the ABS in response to positive and negative magnetic fields from the magnetic disk, it is important to longitudinally bias the free layer (biased parallel to the ABS and parallel to the major planes of the layers of the read element) to avoid unwanted movement or jitter of the magnetic moment of the free layer. Unwanted movement of the magnetic moment adds noise and unwanted frequencies to the signals read from the read element.

One method used to stabilize the magnetic moment of the free layer is to bias the free layer using first and second hard bias magnetic layers that are positioned adjacent to first and second sides of the read element. There are multiple problems with this configuration. First, because the hard bias magnetic layers are on either side of the read element, side shields cannot be inserted on either side of the free layer of the read element. Secondly, the hard bias magnetic layers are insulated from the free layer and the rest of the read element. The insulation and the gap between the magnetic layers and free layer reduce the magnetic field applied to the free layer from the magnetic layers. The reduced magnetic field can provide for weak biasing of the magnetic moment of the free layer. Third, the hard bias magnetic layers do not uniformly bias the free layer. The end portions of the free layer can become over-biased and do not properly respond to magnetic fields from the magnetic disk.

Another method used to stabilize the magnetic moment of the free layer is to bias the free layer using an in-stack biasing layer structure. The in-stack biasing layer structure includes an in-stack pinned bias layer and an in-stack pinning bias layer separated from the free layer by a spacer layer. The pinning bias layer is comprised of antiferromagnetic (AFM) material, such as IrMn. The pinned bias layer is comprised of a ferromagnetic layer that has a magnetization pinned by exchange coupling with the AFM pinning bias layer. The magnetization of the pinned bias layer is pinned parallel to the ABS of the recording head. Magnetostatic coupling between the pinned bias layer and the free layer biases the magnetization of the free layer.

One problem with current in-stack biasing structures is that the biasing layers do not enhance the MR signal within the read element. First, the spacer layer typically used between the pinned bias layer and the free layer is made of a material, such as Ta or Ru, which does not contribute to spin-dependent scattering. Secondly, the pinned bias layer has its magnetization pinned horizontal or parallel to the ABS of the recording head, which does not enhance the MR signal responsive to external magnetic fields. As a result, the in-stack pinned bias layer in traditional read elements only provides for free layer biasing, and does not contribute to the MR signal in the read element.

SUMMARY OF THE SOLUTION

The invention solves the above and other related problems with a pinned layer in a magnetoresistive (MR) element having a canted magnetic moment. With the canted magnetic moment of the pinned layer, the pinned layer acts as a bias layer to bias the free layer, and acts as a reference layer to enhance the MR signal in the MR element. Therefore, MR element designers can advantageously generate a higher resistance in the MR element while still providing in-stack biasing of the free layer.

In one embodiment, an MR element of the invention includes a first pinning layer, a first pinned layer, a first spacer/barrier layer, a free layer, a second spacer/barrier layer, a second pinned layer, and a second pinning layer. The first pinning layer pins the magnetic moment of the first pinned layer at an angle in relation to a sensing surface of the MR element. An example of a sensing surface is an air bearing surface (ABS) of a magnetic recording head. The magnetic moment of the first pinned layer is thus canted in relation to the sensing surface. The magnetic moment of the first pinned layer is canted between about 35 degrees and 55 degrees from the sensing surface.

By having a canted magnetic moment for the first pinned layer, the first pinned layer acts as a bias layer to longitudinally bias the free layer, and acts as a reference layer to enhance the MR signal in the MR element. The transverse component of the canted magnetic moment enhances the MR signal. The longitudinal component of the canted magnetic moment biases the free layer. Therefore, MR element designers can advantageously generate a higher resistance in the MR element while still providing in-stack biasing of the free layer.

In another embodiment of the invention, the first pinned layer includes a first ferromagnetic layer, an antiparallel coupled (APC) layer, and a second ferromagnetic layer. The first ferromagnetic layer and the second ferromagnetic layer have canted magnetic moments that are antiparallel to one another. The second ferromagnetic layer has a width substantially similar to the width of the free layer. The first ferromagnetic layer has a width greater than the width of the second ferromagnetic layer and the width of free layer (individually, not combined). Although the width of the first ferromagnetic layer and the width of the second ferromagnetic layer are different, the volumes of the first ferromagnetic layer and the second ferromagnetic layer are substantially similar. Therefore, the thickness of the second ferromagnetic layer is greater than the thickness of the first ferromagnetic layer in order to equalize the volumes. The proximity of the second ferromagnetic layer to the free layer and the width of the second ferromagnetic layer being similar to the width of the free layer allow magnetic fields from the second ferromagnetic layer to bias the free layer. Because the width of the first ferromagnetic layer is larger than the width of the free layer and the width of the second ferromagnetic layer, the magnetic fields of the first ferromagnetic layer do not bias the free layer.

In another embodiment of the invention, one of the first pinning layer or the second pinning layer is formed from a permanent magnetic material, such as CoPt or CoPtCr. The other of the first pinning layer or the second pinning layer is formed from an antiferromagnetic (AFM) material, such as IrMn or PtMn. By using permanent magnetic material for one of the pinning layers, the magnetic moment of the pinning layer formed from the permanent magnetic material may be set using a strong magnetic field at room temperature (or some substantially lower temperature than is used for annealing the AFM material). Thus, if the magnetic moment of the AFM pinning layer is already set, the process of setting the magnetic moment of the permanent magnetic pinning layer should not affect the magnetic moment of the AFM pinning layer. MR element manufacturers can more efficiently and accurately set the magnetic moments of both pinning layers.

The invention may include other exemplary embodiments described below.

DESCRIPTION OF THE DRAWINGS

The same reference number represents the same element on all drawings.

FIG. 1 illustrates a magnetic disk drive system in an exemplary embodiment of the invention.

FIG. 2 illustrates a recording head in an exemplary embodiment of the invention.

DETAILED DESCRIPTION OF THE INVENTION

Figure 3:
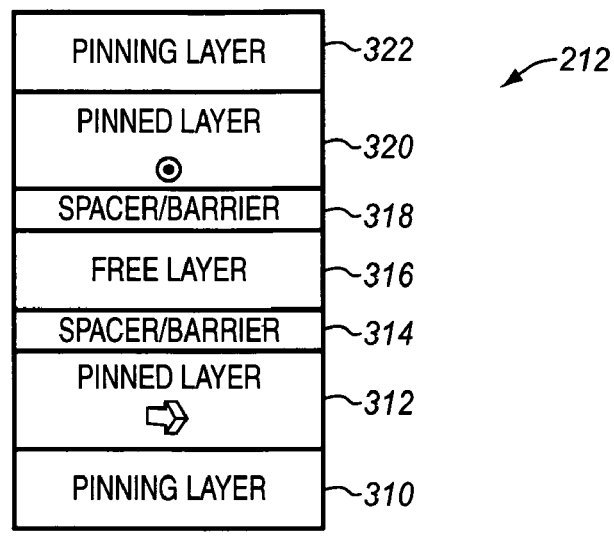
FIG. 3 illustrates a partial composition of a read element in an exemplary embodiment of the invention.

FIGS. 1-6 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

FIG. 1 illustrates a magnetic disk drive system 100 in an exemplary embodiment of the invention. Magnetic disk drive system 100 includes a spindle 102, a magnetic disk 104, a motor controller 106, an actuator 108, an actuator arm 110, a suspension arm 112, and a recording head 114. Spindle 102 supports and rotates a magnetic disk 104 in the direction indicated by the arrow. A spindle motor (not shown) rotates spindle 102 according to control signals from motor controller 106. Recording head 114 is supported by suspension arm 112 and actuator arm 110. Actuator arm 110 is connected to actuator 108 that is configured to rotate in order to position recording head 114 over a desired track of magnetic disk 104. Magnetic disk drive system 100 may include other devices, components, or systems not shown in FIG. 1. For instance, a plurality of magnetic disks, actuators, actuator arms, suspension arms, and recording heads may be used.

When magnetic disk 104 rotates, an air flow generated by the rotation of magnetic disk 104 causes an air bearing surface (ABS) of recording head 114 to ride on a cushion of air a particular height above magnetic disk 104. The height depends on the shape of the ABS. As recording head 114 rides on the cushion of air, actuator 108 moves actuator arm 110 to position a read element (not shown) and a write element (not shown) in recording head 114 over selected tracks of magnetic disk 104.

FIG. 2 illustrates recording head 114 in an exemplary embodiment of the invention. The view of recording head 114 is of the ABS side of recording head 114. Recording head 114 has a cross rail 202, two side rails 204-205, and a center rail 206 on the ABS side. The rails on recording head 114 illustrate just one embodiment, and the configuration of the ABS side of recording head 114 may take on any desired form. Recording head 114 also includes a write element 210 and a read element 212 on a trailing edge 214 of recording head 114.

FIG. 3 illustrates a partial composition of read element 212 in an exemplary embodiment of the invention. The view of FIG. 3 is from the ABS of recording head 114 (see FIG. 2), wherein the ABS is coplanar to the surface of the page. Read element 212 may be a current in plane (CIP) read element or a current perpendicular to the planes (CPP) read element. Read element 212 includes a first pinning layer 310, a first pinned layer 312, a first spacer/barrier layer 314, a free layer 316, a second spacer/barrier layer 318, a second pinned layer 320, and a second pinning layer 322. FIG. 3 is just an illustration of one embodiment, and read element 212 may include other layers, such as a cap layer, a seed layer, shields, etc.

Although FIG. 3 illustrates a read element 212 for a magnetic disk drive system 100, this invention applies generally to any MR element.

The first pinning layer 310 of read element 212 pins the magnetic moment of the first pinned layer 312 at an angle in relation to the ABS of the recording head 114 (see FIG. 2). The ABS is the sensing surface in this embodiment, meaning that it is the surface positioned adjacent to media or other device providing external magnetic fields being sensed by the MR element. The magnetic moment of the first pinned layer 312 is thus canted in relation to the ABS. Canted is defined herein as set or pinned at an angle to a parallel or perpendicular position in relation to the ABS. The magnetic moment of the first pinned layer 312 is canted between about 35 degrees and 55 degrees from the ABS, with a 45 degree angle being preferred in one embodiment. The transverse component of the canted magnetic moment works in combination with the magnetic moment of the free layer 316 to enhance the MR signal in the read element 212 or to enhance the MR response of the read element 212. The longitudinal component of the canted magnetic moment provides external magnetic fields to bias the free layer 316.

The magnetic moment of the first pinned layer 312 is illustrated by the canted arrow in FIG. 3. FIG. 3 is a two dimensional drawing and does not accurately illustrate the angle between parallel (the plane of the page of FIG. 3) and perpendicular (into or out of the page of FIG. 3) to the ABS. The arrow in FIG. 3 shows that the magnetic moment of the first pinned layer 312 is not parallel or perpendicular to the ABS, but somewhere in between. The magnetic moment of the first pinned layer 312 may be rotated on a plane going into and coming out of the page of FIG. 3. If the magnetic moment points left or right in FIG. 3, then it is parallel to the ABS. If the magnetic moment points into or out of the page in FIG. 3, then it is perpendicular to the ABS. The magnetic moment of the first pinned layer 312 is canted between parallel and perpendicular.

The first pinned layer 312 may comprise a single ferromagnetic layer (such as CoFe) as in FIG. 3, or may comprise two ferromagnetic layers separated by an antiparallel coupling (APC) layer, such as Ru. In the two layer example, both layers have canted magnetic moments that are antiparallel to one another (see FIG. 4).

Spacer/barrier layer 314 and spacer/barrier layer 318 may comprise a spacer layer or a barrier layer depending on the desired configuration of recording head 212. A spacer layer is known to those skilled in the art as a layer of non-magnetic material between a pinned layer and a free layer. The spacer layer contributes to spin-dependent scattering, such as a spacer layer between a traditional pinned layer and the free layer in GMR read elements. A spacer layer that contributes to spin-dependent scattering may be formed from Cu, Au, Ag, or similar material. A barrier layer is known to those skilled in the art as a thin layer of insulating material, such as $Al_2O_3$ or MgO that allows for quantum-mechanical tunneling of charge carriers in MTJ read elements.

The free layer 316 may have multiple desired configurations. In one embodiment, free layer 316 is comprised of two layers of ferromagnetic layers, such as a first layer of CoFe and a second layer of NiFe. In another embodiment, free layer 316 is comprised of three layers of ferromagnetic material, such as a first layer of CoFe, a second layer of NiFe, and a third layer of CoFe.

The second pinning layer 322 pins the magnetic moment of the second pinned layer 320 perpendicular to the ABS of the recording head 114 (see FIG. 2). The magnetic moment of the second pinned layer 320 is illustrated by the arrow tail in FIG. 3. The second pinned layer 320 may comprise a single ferromagnetic layer (such as CoFe), or may comprise two ferromagnetic layers separated by an antiparallel coupling (APC) layer, such as Ru. In the two layer example, both layers have their magnetic moment pinned perpendicular to the ABS by the second pinning layer 322.

By having a canted magnetic moment for the first pinned layer 312, the first pinned layer 312 acts as a bias layer to bias the free layer 316, and acts as a reference layer to enhance the MR signal in the read element 212. The transverse component of the canted magnetic moment enhances the MR signal. The longitudinal component of the canted magnetic moment biases the free layer 316. Therefore, recording head designers can advantageously generate a higher resistance in the read element 212 while still providing in-stack biasing of the free layer 316.

Both of the pinning layers 310, 322 may be formed from an antiferromagnetic (AFM) material, such as IrMn or PtMn, in one embodiment. In another embodiment, one of the pinning layers 310, 322 is formed from a permanent magnetic material, such as CoPt or CoPtCr, and the other of the pinning layers 310, 322 is formed from an AFM material. By using permanent magnetic material for one of the pinning layers, the magnetic moment of the pinning layer formed from the permanent magnetic material may be set using a strong magnetic field at room temperature (or some substantially lower temperature than is used for annealing the AFM material). Thus, if the magnetic moment of the AFM pinning layer is already set, the process of setting the magnetic moment of the permanent magnetic pinning layer should not affect the magnetic moment of the AFM pinning layer. Recording head manufacturers can more efficiently and accurately set the magnetic moments of both pinning layers.

Figure 4:
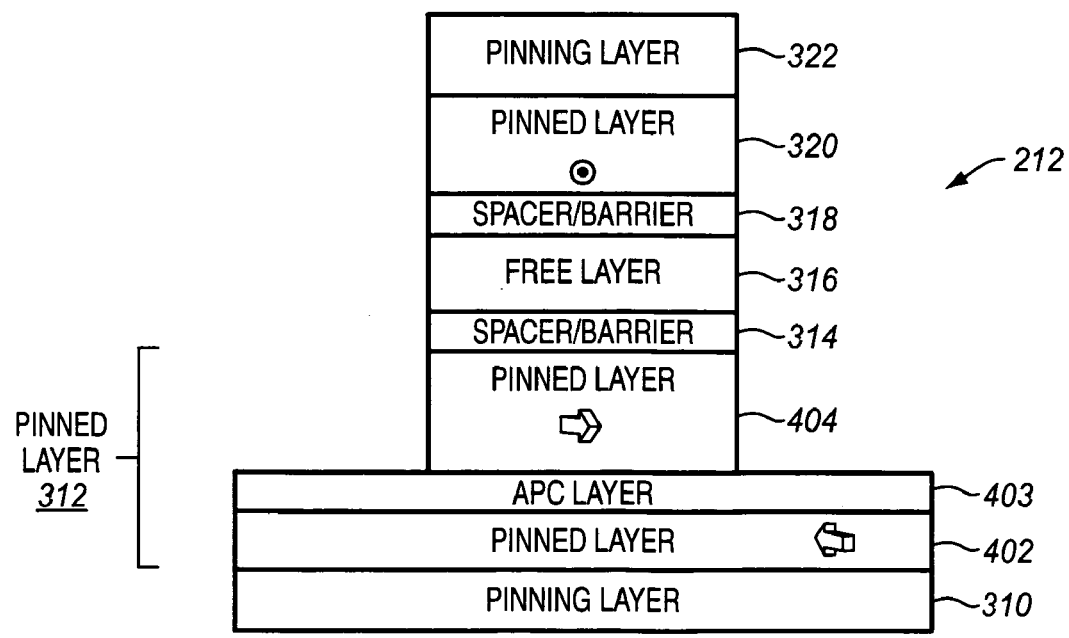
FIG. 4 illustrates another partial composition of the read element of FIG. 3 in an exemplary embodiment of the invention.

FIG. 4 illustrates another partial composition of read element 212 in an exemplary embodiment of the invention. FIG. 4 shows another embodiment of the first pinning layer 310 and the first pinned layer 312 of read element 212. Read element 212 is not limited to this embodiment.

In this embodiment, the first pinned layer 312 includes a first ferromagnetic layer 402, an antiparallel coupled (APC) layer 403, and a second ferromagnetic layer 404. The first ferromagnetic layer 402 and the second ferromagnetic layer 404 have canted magnetic moments that are antiparallel to one another (as is illustrated by the arrows).

The second ferromagnetic layer 404 has a width substantially similar to the width of free layer 316. The first ferromagnetic layer 402 has a width greater than the width of the second ferromagnetic layer 404 and the width of free layer 316 (individually, not combined). The width of the first ferromagnetic layer 402 is at least twice as wide as the width of the second ferromagnetic layer 404 and the width of free layer 316, or in the range of two to five times as wide (FIG. 4 is not drawn to scale).

Although the width of the first ferromagnetic layer 402 and the width of the second ferromagnetic layer 404 are different, the volumes of the first ferromagnetic layer 402 and the second ferromagnetic layer 404 are substantially similar. Therefore, the thickness of the second ferromagnetic layer 404 is greater than the thickness of the first ferromagnetic layer 402 in order to equalize the volumes. For instance, the thickness of the second ferromagnetic layer 404 may be about 40 Å and the thickness of the first ferromagnetic layer 402 may be about 20 Å in one embodiment. To equalize the volumes, the width of the first ferromagnetic layer 402 may be twice as wide as the width of the first ferromagnetic layer 404. There is very strong pinning between the first ferromagnetic layer 402 and the second ferromagnetic layer 404 because the volume magnetic moments of the first ferromagnetic layer 402 and the second ferromagnetic layer 404 are comparable and cancel each other out (or very nearly cancel each other out). Thicknesses and widths of the first ferromagnetic layer 402 and the second ferromagnetic layer 404 are selected to achieve nearly identical volumes to cancel the net magnetic moment. The thickness of the second ferromagnetic layer 404 as compared to free layer 316 is also important. The thickness of the second ferromagnetic layer 404 should be 1.2 to 1.5 times as thick as free layer 316.

The different widths of the first ferromagnetic layer 402 and the second ferromagnetic layer 404 affects the magnitude of the bias field generated by pinned layer 312 to bias free layer 316. The proximity of the second ferromagnetic layer 404 to free layer 316 and the width of the second ferromagnetic layer 404 being similar to the width of free layer 316 allow magnetic fields from the second ferromagnetic layer 404 to provide improved biasing of free layer 316. Because the width of the first ferromagnetic layer 402 is larger than the width of free layer 316 and the width of the second ferromagnetic layer 404, the magnetic fields of the first ferromagnetic layer 402 do not bias free layer 316. The magnetic poles at the edges of the second ferromagnetic layer 404 bias free layer 316 being in close proximity to free layer 316 whereas magnetic poles at the edges of the first ferromagnetic layer 402 do not bias free layer 316 being at a far distance from free layer 316.

Figure 5:
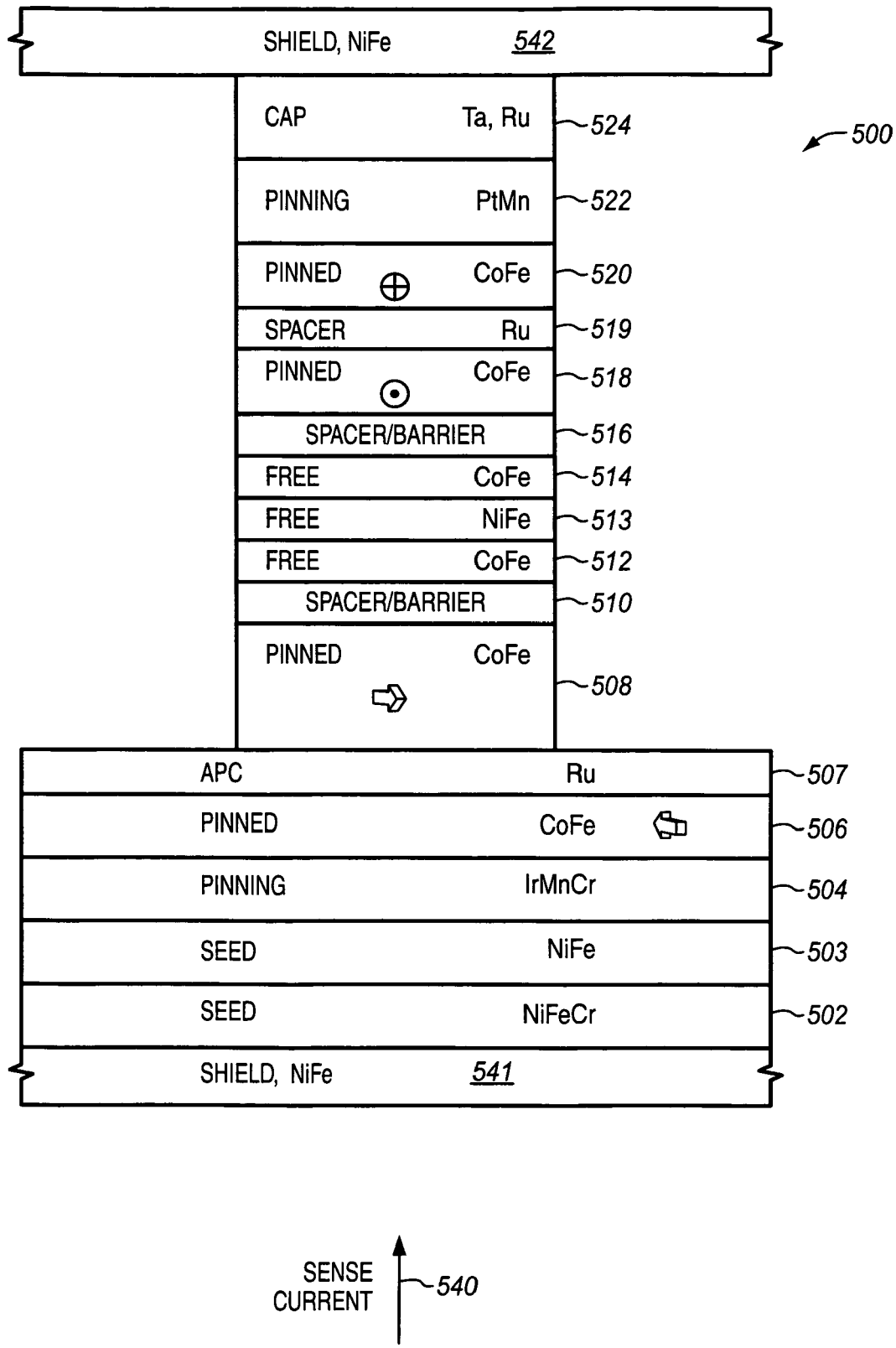
FIG. 5 illustrates another read element in an exemplary embodiment of the invention.

FIG. 5 illustrates a read element 500 in a recording head in an exemplary embodiment of the invention. The view of read element 500 is from an ABS side of the recording head (not shown) that includes read element 500. Read element 500 may illustrate one embodiment of read element 212 shown in FIGS. 3-4, but read element 212 is not limited to the structure of read element 500. The layer materials described for read element 500 are just one example and other equivalent materials may be used for the layers.

Read element 500 is sandwiched between shield layers 541-542. Shield layers 541-542 are formed from NiFe. Read element 500 further includes a seed layer 502-503. The seed layer 502-503 includes a first layer 502 of NiFeCr and a second layer 503 of NiFe.

Read element 500 further includes a first pinning layer 504 and a first pinned layer 506-508. The first pinning layer 504 is formed from an AFM material in this embodiment, such as IrMnCr. The first pinned layer 506-508 comprises a first ferromagnetic pinned layer 506 formed of CoFe and a second ferromagnetic pinned layer 508 formed of CoFe separated by a spacer layer 507 formed of Ru. The first pinning layer 504 is exchange coupled with the first ferromagnetic pinned layer 506 and pins the magnetic moment of the first ferromagnetic pinned layer 506 so that the magnetic moment is canted in relation to the ABS of the recording head (not shown). The canted magnetic moment is illustrated by the arrow in layer 506. The first ferromagnetic pinned layer 506 is antiparallel coupled with the second ferromagnetic pinned layer 508 and pins the magnetic moment of the second ferromagnetic pinned layer 508 so that the magnetic moment is canted in relation to the ABS of the recording head (not shown). The canted magnetic moment is illustrated by the arrow in layer 508.

The second ferromagnetic pinned layer 508 has a width substantially similar to the width of free layer 512-514. The first ferromagnetic pinned layer 506 is about twice as wide as the width of the second ferromagnetic pinned layer 508 and the width of free layer 512-514. For instance, to substantially equalize the volumes of the first ferromagnetic pinned layer 506 and the second ferromagnetic pinned layer 508, the thickness of the second ferromagnetic pinned layer 508 may be about 40 Å and the thickness of the first ferromagnetic pinned layer 506 may be about 20 Å (assuming that the depths are approximately equal).

Read element 500 further includes a spacer/barrier layer 510, a free layer 512-514, and a spacer/barrier layer 516. Spacer/barrier layer 510 is adjacent to the second ferromagnetic pinned layer 508. Free layer 512-514 is adjacent to spacer/barrier layer 510. Spacer/barrier layer 516 is adjacent to free layer 512-514. Spacer/barrier layer 510 and spacer/barrier layer 516 may comprise a spacer layer or a barrier layer depending on whether read element 500 is a GMR read element or an MTJ read element. If read element 500 comprises a GMR read element, then spacer/barrier layer 510 and spacer/barrier layer 516 are formed from Cu, Au, Ag, or similar material. If read element 500 comprises an MTJ read element, then spacer/barrier layer 510 and spacer/barrier layer 516 are formed from a thin layer of $Al_2O_3$ or MgO. The free layer 512-514 is comprised of three layers in this embodiment. The free layer 512-514 comprises a first layer 512 of CoFe, a second layer 513 of NiFe, and a third layer 514 of CoFe.

Read element 500 further includes a second pinning layer 522 and a second pinned layer 518-520. The second pinning layer 522 is formed of an antiferromagnetic (AFM) material, such as PtMn. The second pinned layer 518-520 comprises a first ferromagnetic pinned layer 520 formed of CoFe and a second ferromagnetic pinned layer 518 formed of CoFe separated by a spacer layer 519 formed of Ru. The second pinning layer 522 is exchange coupled with the first ferromagnetic pinned layer 520 and pins the magnetic moment of the first ferromagnetic pinned layer 520 perpendicular to the ABS of the recording head (not shown). The magnetic moment is illustrated by the arrow tail in layer 520. The first ferromagnetic pinned layer 520 is antiparallel coupled with the second ferromagnetic pinned layer 518 and pins the magnetic moment of the second ferromagnetic pinned layer 518 perpendicular to the ABS of the recording head (not shown). The magnetic moment is illustrated by the arrow head in layer 518.

Read element 500 in this embodiment includes a cap layer 524 formed from a material such as Ta or Ru. Cap layer 524 protects other layers from subsequent processing steps.

By having a canted magnetic moment for the first pinned layer 506-508, the first pinned layer 506-508 acts as a bias layer to bias the free layer 512-514, and acts as a reference layer to enhance the MR signal in the read element 500. The transverse component of the canted magnetic moment enhances the MR signal. The longitudinal component of the canted magnetic moment biases the free layer 512-514. Therefore, recording head designers can advantageously generate a higher resistance in the read element 500 while still providing in-stack biasing of the free layer 512-514.

The different widths of the first ferromagnetic pinned layer 506 and the second ferromagnetic pinned layer 508 affect the magnitude of the bias field generated to bias free layer 512-514. The proximity of the second ferromagnetic pinned layer 508 to free layer 512-514 and the width of the second ferromagnetic pinned layer 508 being similar to the width of free layer 512-514 allows magnetic fields from the second ferromagnetic pinned layer 508 to provide improved biasing of free layer 512-514. Because the width of the first ferromagnetic pinned layer 506 is twice as wide as the width of free layer 512-514 and the width of the second ferromagnetic pinned layer 508, magnetic fields of the first ferromagnetic pinned layer 506 do not bias free layer 514. The magnetic poles at the edges of the second ferromagnetic pinned layer 508 bias free layer 512-514 being in close proximity to free layer 512-514 whereas magnetic poles at the edges of the first ferromagnetic pinned layer 506 do not bias free layer 512-514 being at a far distance from free layer 514.

Shield layers 541-542 provide electrical connections for flow of a sense current 540 from a current source (not shown) to read element 500. Sense current 540 may be conducted through read element 500 from bottom to top, as shown in FIG. 5, or from top to bottom. Due to the direction of sense current 540 through read element 500, read element 500 is considered a current perpendicular to the planes (CPP) read element.

Read element 500 may be fabricated in a magnetron sputtering or an ion beam sputtering system to sequentially deposit the multilayer structure shown in FIG. 5. Shield layer 541 formed of NiFe is deposited on a substrate (not shown). The seed layers 502-503 are then formed by sequentially depositing the NiFeCr layer 502 and the NiFe layer 503. The first pinning layer 504 formed from IrMnCr is then deposited. The first pinned layer 506-508 is then formed by depositing the CoFe layer 506 (70% Co; 30% Fe), the Ru layer 507, and the CoFe layer 508 (50% Co; 50% Fe). The spacer/barrier layer 510 of the appropriate material is then deposited. The free layer 512-514 is then formed by depositing the CoFe layer 512, the NiFe layer 513, and the CoFe layer 514. The spacer/barrier layer 516 of the appropriate material is then deposited. The second pinned layer 518-520 is then formed by depositing the CoFe layer 518 (50% Co; 50% Fe), the Ru layer 519, and the CoFe layer 520 (90% Co; 10% Fe). The second pinning layer 522 formed from PtMn is then deposited. The cap layer 524 formed from Ta or Ru is then deposited.

With the above layers deposited, read sensor 500 is fabricated to generate a desired width of the first pinned layer 506-508. In one embodiment, read sensor 500 is Ion-milled down to the Ru layer 507 of the first pinned layer 506-508 to generate the desired width of pinned layer 508. However, Ru layer 507 is very thin (4 Å) making it difficult to mill down to the Ru layer 507 without accidentally milling into pinned layer 506. To avoid this problem in another embodiment, read sensor 500 is Ion-milled partially into pinned layer 508. The remaining portion of pinned layer 508 is oxidized to make it non-magnetic, which generates the desired width of pinned layer 508. Shield layer 542 is then deposited over cap layer 524.

The following lists example thicknesses and widths of the layers of read element 500. Shield layers 541-542 are about one micron thick. Seed layer 502 is about 30 Å thick and seed layer 503 is about 4 Å thick. The first pinning layer 504 is about 75 Å thick. Pinned layer 506 is about 20 Å, spacer layer 507 is about 4 Å, and pinned layer 508 is about 40 Å thick. If spacer/barrier layer 510 comprises a spacer layer (such as Cu), then spacer/barrier layer 510 is about 20 Å thick. If spacer/barrier layer 510 comprises a barrier layer, then spacer/barrier layer 510 is about 5 Å thick. Free layers 512-514 are each about 10 Å thick. Spacer/barrier layer 516 has a similar thickness as spacer/barrier layer 510. Pinned layer 518 is about 40 Å, spacer layer 519 is about 4 Å, and pinned layer 520 is about 40 Å thick. The second pinning layer 522 is about 150 Å thick. Cap layer 506 is about 40 Å thick.

Figure 6:
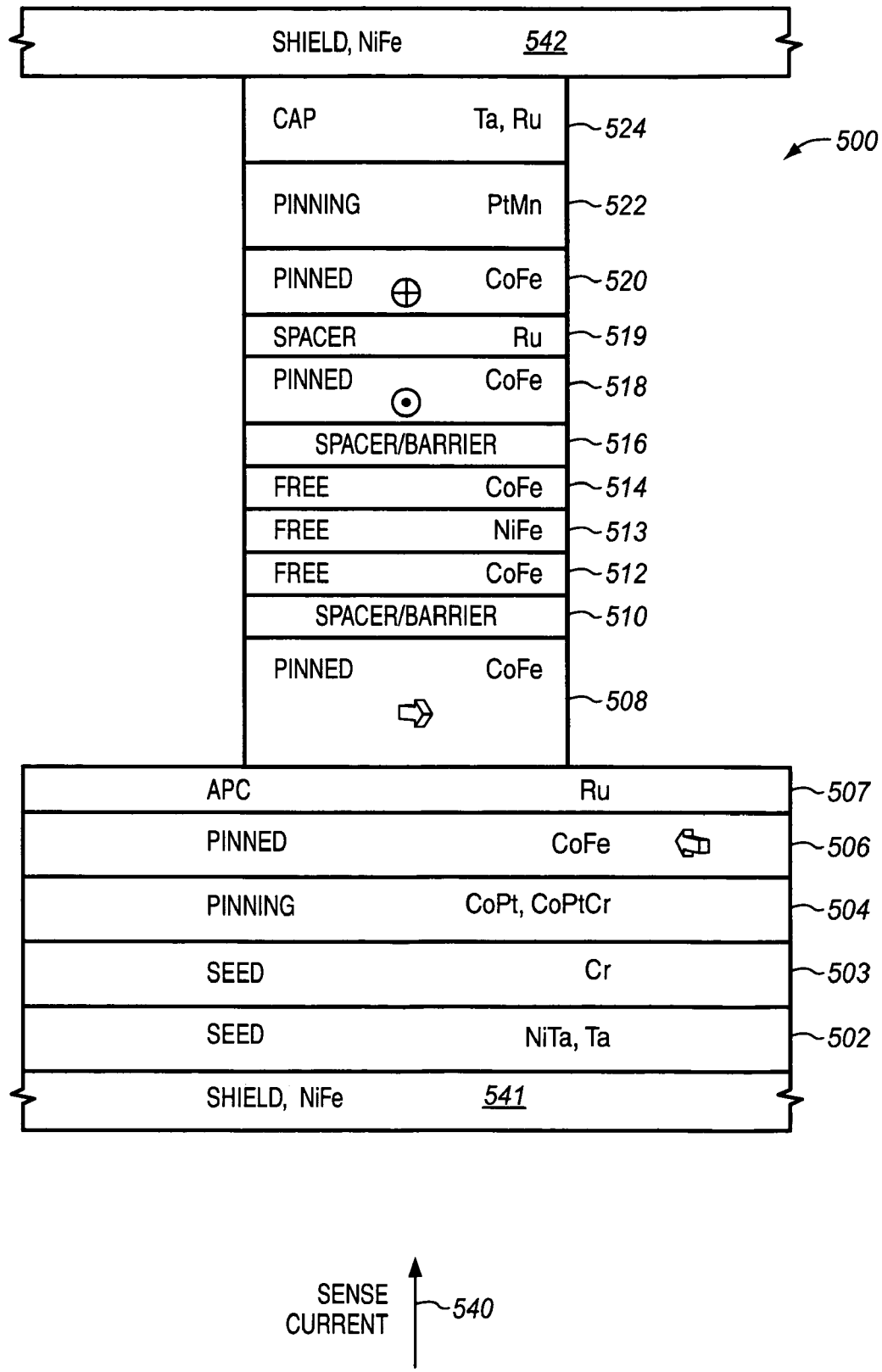
FIG. 6 illustrates another read element in an exemplary embodiment of the invention.

FIG. 6 illustrates another embodiment of read element 500 in an exemplary embodiment of the invention. Read element 500 includes the same layers as in FIG. 5, except that the first pinning layer 504 and the seed layer 502-503 have been changed.

In this embodiment, the first pinning layer 504 is formed from a permanent magnetic material instead of an AFM material. The permanent magnetic material may be CoPt, CoPtCr, or another equivalent material. The first pinning layer 504 is exchange coupled with the first ferromagnetic pinned layer 506 and pins the magnetic moment of the first ferromagnetic pinned layer 506, so that the magnetic moment is canted in relation to the ABS of the recording head (not shown). The canted magnetic moment is illustrated by the arrow in layer 506. The first ferromagnetic pinned layer 506 is antiparallel coupled with the second ferromagnetic pinned layer 508 and pins the magnetic moment of the second ferromagnetic pinned layer 508 so that the magnetic moment is canted in relation to the ABS of the recording head (not shown). The canted magnetic moment is illustrated by the arrow in layer 508.

In this embodiment, the seed layer 502-503 includes a first layer 502 of NiTa or Ta and a second layer 503 of Cr. The Cr layer 503 defines the crystallographic texture or grain size of the first pinning layer 504. The NiTa or Ta layer 502 acts as a buffer between shield 541 and the first pinning layer 504. The NiTa or Ta layer 502 is an amorphous material that acts to buffer shield 541 from changing or affecting the crystallographic texture or grain size of the first pinning layer 504.

Although specific embodiments were described herein, the scope of the invention is not limited to those specific embodiments. The scope of the invention is defined by the following claims and any equivalents thereof.

I claim:

1. A magnetoresistive (MR) element, comprising:
   a first pinning layer;
   a first pinned layer having a canted magnetic moment in relation to a sensing surface of the MR element;
   a first spacer/barrier layer;
   a free layer;
   a second spacer/barrier layer;
   a second pinned layer having a magnetization substantially perpendicular to the sensing surface of the MR element; and
   a second pinning layer;
   wherein the transverse component of the canted magnetic moment of the first pinned layer enhances the MR signal in the MR element and the longitudinal component of the canted magnetic moment biases the magnetic moment of the free layer.

2. The MR element of claim 1 wherein the magnetic moment of the first pinned layer is canted between parallel to the sensing surface of the MR element and perpendicular to the sensing surface.

3. The MR element of claim 2 wherein the magnetic moment of the first pinned layer is canted between 35 degrees and 55 degrees from the sensing surface.

4. The MR element of claim 3 wherein the magnetic moment of the first pinned layer is canted about 45 degrees from the sensing surface.

5. The MR element of claim 1 wherein the first pinned layer comprises:
   a first ferromagnetic layer;
   a second ferromagnetic layer having a width substantially similar to a width of the free layer; and
   an antiparallel coupling (APC) layer between the first ferromagnetic layer and the second ferromagnetic layer;
   wherein the first ferromagnetic layer has a width two to five times greater than the width of the second ferromagnetic layer and the width of the free layer;
   wherein the second ferromagnetic layer has a thickness greater than the thickness of the first ferromagnetic layer so that the first ferromagnetic layer and the second ferromagnetic layer have substantially similar volumes.

6. The MR element of claim 5 wherein magnetic fields of the second ferromagnetic layer bias the free layer while magnetic fields of the first ferromagnetic layer do not bias the free layer.

7. The MR element of claim 1 wherein one of the first pinning layer and the second pinning layer is formed from a permanent magnetic material and the other of the first pinning layer and the second pinning layer is formed from an antiferromagnetic (AFM) material.

8. The MR element of claim 7 wherein the permanent magnetic material comprises one of CoPt or CoPtCr.

9. The MR element of claim 1 wherein the MR element comprises a current perpendicular to the planes (CPP) element.

10. A recording head of a magnetic disk drive system, the recording head comprising:
    a magnetoresistive (MR) read element operable to read data from a magnetic disk of the magnetic disk drive system, the MR read element comprising:
    a first pinning layer;
    a first pinned layer having a canted magnetic moment in relation to an air bearing surface (ABS) of the recording head;
    a first spacer/barrier layer;
    a free layer;
    a second spacer/barrier layer;
    a second pinned layer having a magnetization substantially perpendicular to the ABS of the recording head; and
    a second pinning layer;
    wherein the transverse component of the canted magnetic moment of the
    first pinned layer enhances the MR signal in the MR element and the longitudinal component of the canted magnetic moment biases the magnetic moment of the free layer.

11. The recording head of claim 10 wherein the magnetic moment of the first pinned layer is canted between parallel to the ABS of the recording head and perpendicular to the ABS.

12. The recording head of claim 11 wherein the magnetic moment of the first pinned layer is canted between 35 degrees and 55 degrees from the ABS.

13. The recording head of claim 12 wherein the magnetic moment of the first pinned layer is canted about 45 degrees from the ABS.

14. The recording head of claim 10 wherein the first pinned layer comprises:
    a first ferromagnetic layer;
    a second ferromagnetic layer having a width substantially similar to a width of the free layer; and
    an antiparallel coupling (APC) layer between the first ferromagnetic layer and the second ferromagnetic layer;
    wherein the first ferromagnetic layer has a width two to five times greater than the width of the second ferromagnetic layer and the width of the free layer;
    wherein the second ferromagnetic layer has a thickness greater than the thickness of the first ferromagnetic layer so that the first ferromagnetic layer and the second ferromagnetic layer have substantially similar volumes.

15. The recording head of claim 14 wherein magnetic fields of the second ferromagnetic layer bias the free layer while magnetic fields of the first ferromagnetic layer do not bias the free layer.

16. The recording head of claim 10 wherein one of the first pinning layer and the second pinning layer is formed from a permanent magnetic material and the other of the first pinning layer and the second pinning layer is formed from an antiferromagnetic (AFM) material.

17. The recording head of claim 16 wherein the permanent magnetic material comprises one of CoPt or CoPtCr.

18. The recording head of claim 10 wherein the MR read element comprises a current perpendicular to the planes (CPP) read element.

19. The recording head of claim 10 wherein the free layer comprises:
    a first layer of CoFe;
    a second layer of NiFe; and
    a third layer of CoFe.

20. A magnetic disk drive system, comprising:
    a magnetic disk; and
    a recording head having a magnetoresistive (MR) read element operable to read data from the magnetic disk, the MR read element comprising:

a first pinning layer;

a first pinned layer having a canted magnetic moment in relation to an air bearing surface (ABS) of the recording head;

a first spacer/barrier layer;

a free layer;

a second spacer/barrier layer;

a second pinned layer having a magnetization substantially perpendicular to the ABS of the recording head; and a second pinning layer wherein the transverse component of the canted magnetic moment of the first pinned layer enhances the MR signal in the MR element and the longitudinal component of the canted magnetic moment biases the magnetic moment of the free layer.

21. The magnetic disk drive system of claim 20 wherein the magnetic moment of the first pinned layer is canted between parallel to the ABS of the recording head and perpendicular to the ABS.

22. The magnetic disk drive system of claim 21 wherein the magnetic moment of the first pinned layer is canted between 35 degrees and 55 degrees from the ABS.

23. The magnetic disk drive system of claim 22 wherein the magnetic moment of the first pinned layer is canted about 45 degrees from the ABS.

24. The magnetic disk drive system of claim 20 wherein the first pinned layer comprises:

a first ferromagnetic layer;

a second ferromagnetic layer having a width substantially similar to a width of the free layer; and an antiparallel coupling (APC) layer between the first ferromagnetic layer and the second ferromagnetic layer;

wherein the first ferromagnetic layer has a width two to five times greater than the width of the second ferromagnetic layer and the width of the free layer;

wherein the second ferromagnetic layer has a thickness greater than the thickness of the first ferromagnetic layer so that the first ferromagnetic layer and the second ferromagnetic layer have substantially similar volumes.

25. The magnetic disk drive system of claim 24 wherein magnetic fields of the second ferromagnetic layer bias the free layer while magnetic fields of the first ferromagnetic layer do not bias the free layer.

26. The magnetic disk drive system of claim 20 wherein one of the first pinning layer and the second pinning layer is formed from a permanent magnetic material and the other of the first pinning layer and the second pinning layer is formed from an antiferromagnetic (AFM) material.

27. The magnetic disk drive system of claim 26 wherein the permanent magnetic material comprises one of CoPt or CoPtCr.

28. The magnetic disk drive system of claim 20 wherein the MR read element comprises a current perpendicular to the planes (CPP) read element.

29. The magnetic disk drive system of claim 20 wherein the free layer comprises:

a first layer of CoFe;

a second layer of NiFe; and a third layer of CoFe.

* * * * *

UNITED STATES PATENT AND TRADEMARK OFFICE
CERTIFICATE OF CORRECTION

PATENT NO. : 7,423,849 B2
APPLICATION NO. : 11/229920
DATED : September 9, 2008
INVENTOR(S) : Hardayal S. Gill It is certified that error appears in the above-identified patent and that said Letters Patent is hereby corrected as shown below:

Title page, item [73]
Assignee name "Hitachi Global Sotrage Technologies Netherlands, B.V. (NL)" should read --Hitachi Global Storage Technologies Netherlands, B.V. (NL)--

At column 8, lines 62-63, the word "comprrises" should read --comprises--.

Signed and Sealed this

Sixteenth Day of December, 2008

JON W. DUDAS
*Director of the United States Patent and Trademark Office*